United States Patent [19]

Ogata et al.

[11] Patent Number: 5,009,923

[45] Date of Patent: Apr. 23, 1991

[54] METHOD OF FORMING DIAMOND FILM

[75] Inventors: Kiyoshi Ogata; Yasunori Ando; Eiji Kamijo, all of Kyoto, Japan

[73] Assignee: Nissin Electric Co., Ltd., Kyoto, Japan

[21] Appl. No.: 544,800

[22] Filed: Jun. 27, 1990

Related U.S. Application Data

[63] Continuation of Ser. No. 274,690, Nov. 22, 1988, abandoned, which is a continuation of Ser. No. 43,517, Apr. 28, 1987, abandoned.

[30] Foreign Application Priority Data

| Apr. 28, 1986 | [JP] | Japan | 61-98888 |
| Feb. 19, 1987 | [JP] | Japan | 62-37576 |
| Apr. 8, 1987 | [JP] | Japan | 62-87624 |

[51] Int. Cl.$^5$ .............................................. B05D 3/06
[52] U.S. Cl. ...................................... 427/38; 427/249; 427/294; 427/350; 427/377
[58] Field of Search ................. 427/38, 249, 294, 350, 427/377

[56] References Cited

U.S. PATENT DOCUMENTS 4,490,229 12/1984 Mirtich et al. .
4,503,125 3/1985 Nelson et al. .................... 428/408
4,618,505 10/1986 MacIver et al. .................... 427/38

OTHER PUBLICATIONS

Weissmantel, C., "Preparation and Properties of Hard i-C and i-BN Coatings", Thin Solid Films, 96:31-44 (1982).
Patent Abstracts of Japan, vol. 10, No. 49, (C-330) [2106], Feb. 26, 1986; and JP-A-60 195 094 (Kogyo Gijutsuin) 3-10-85.

*Primary Examiner*—Bernard Pianalto
*Attorney, Agent, or Firm*—Sughrue, Mion, Zinn, Macpeak & Seas

[57] ABSTRACT

A method of forming a diamond film on a substrate comprises the steps of depositing carbon on said substrate in vacuum by vapor deposition, and irradiating accelerated ions onto said substrate, said ions being obtained by ionizing a gas composed of at least one of a hydrogen gas, inert gases, hydrocarbon gases, organic compound gases and silicon base gases.

8 Claims, 5 Drawing Sheets

METHOD OF FORMING DIAMOND FILM

This is a continuation of application No. 07/274,690 filed Nov. 22, 1988 now abandoned. Which is a continuation of application Ser. No. 07/043,517 filed on Apr. 28, 1987 now abandoned.

BACKGROUND OF THE INVENTION

The present invention relates to a method of forming a thin diamond film.

Conventionally, a thin diamond film has been formed (synthesized) on a substrate by means of the chemical gaseous phase growth method such as plasma CVD and photo CVD methods using hydrocarbon or organic compound gases.

Under the aforesaid conventional methods, however, the following problems have been present:

(1) Use of the hydrocarbon or organic compound gas causes graphite to separate as diamond crystals grow.

(2) The quality of the material usable for a substrate is limited to a great extent because the substrate and the gaseous atmosphere must be heated to high temperatures (e.g., about 800° C. -1000° C.).

(3) The kinetic energy of the ions produced in the gas phase roughly ranges from several 10 to several 100 eV to the atmost so that the energy of the ions arriving at the substrate is extremely small. Thus a diamond film is not fixedly adhered to the substrate and is apt to peel off.

SUMMARY OF THE INVENTION

An object of the present invention is therefore to provide a method of forming a thin diamond film on a substrate in which the aforesaid problems can be eliminated.

The method of forming a diamond film on a substrate according to the present invention comprises the steps of depositing carbon atoms on the substrate in vacuum by vapor deposition, and irradiating accelerated ions onto the substrate, the ions being obtained by ionizing a gas composed of at least one of the hydrogen gas, inert gases, hydrocarbon gases, organic compound gases and silicon base gases.

When the ions are irradiated onto the substrate with carbon atoms deposited thereon, the irradiated ions act as a nucleus forming energy supply source to form diamond crystals from the carbon deposited on the substrate and a diamond film is thus formed thereon.

DETAILED DESCRIPTION OF THE PREFERRED EMBODIMENTS

Figure 1:
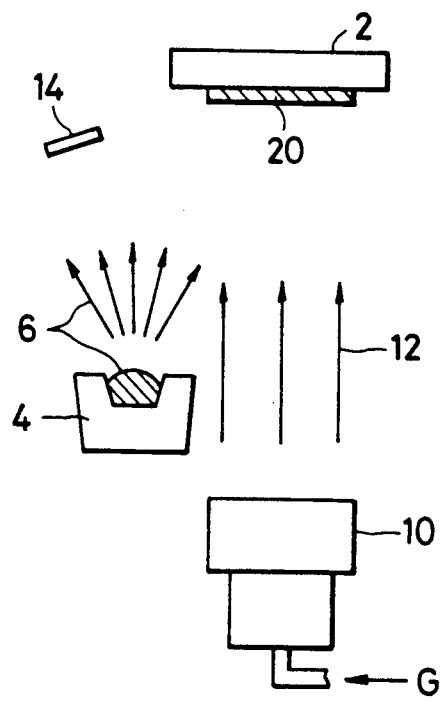
FIG. 1 is a schematic view of an apparatus for implementing a method of the present invention.

FIG. 1 is a schematic view of an apparatus for implementing a method of the present invention. A substrate 20 (e.g., base plate) attached to a sample holder 2 is contained in a vacuum container (not shown) and evaporation and ion source 4, 10 are respectively disposed opposite to the substrate 20. As the substrate 20, e.g., various materials such as a metal, ceramics may be usable. The evaporation source 4 is an electron beam evaporation source, contains carbon 6 as an evaporation material and, by heating and evaporating the carbon 6, capable of depositing the carbon 6 on the surface of the substrate 20. Instead of the electron beam evaporation source, use can be made of evaporation source by means of sputtering of carbon target or vacuum arc discharging of a carbon cathode.

The speed at which the carbon 6 is deposited on the substrate 20 or the thickness of the film prepared thereon can be measured by a film thickness monitor 14.

The ion source 10 is preferably a bucket type ion source employing a multiple magnetic filed for confining the plasma, which is capable of ionizing the supplied gas G and irradiating the ions (ion beam) having a uniform large area onto the surface of the substrate 20 so that a large area can be processed at a time. Ion sources of other types in place of the bucket type ion source may be used.

As the gas G to be supplied to the ion source 10, use is made of a gas composed of at least one of the hydrogen gas, inert gases such as argon gas, hydrocarbon gases, organic compound gases, and silicon base gases such as monosilane ($SiH_4$) and disilane ($Si_2H_6$). For example, the silicon base gases may be contained by 0.1-10% (volume %) in a mixed gas.

The method of forming the film comprises discharging air from the vacuum container up to about $10^{-5} - 10^{-7}$ Torr, depositing the carbon 6 from the evaporation source 4 onto the substrate 20 and simultaneously or alternately irradiating the ions 12 from the ion source 10 onto the substrate 20. At that time, the ratio C/ion of particles (the ratio of composition) of the carbon 6 deposited on the substrate 20 to those of the ions irradiated onto the substrate 20 should properly be selected.

Figure 2:
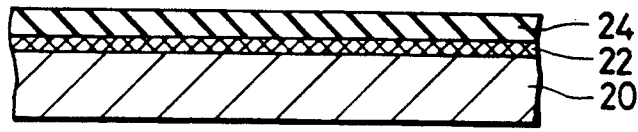
FIG. 2 is a schematic sectional view of an enlarged substrate on which a diamond film is formed by the method according to the present invention.

In the above case, the ions 12 act as nucleus forming energy supply source to form diamond crystals from the carbon 6 deposited on the substrate 20 and, as shown in FIG. 2, a thin diamond film 24 is formed on the surface of the substrate 20. When a silicon base gas is employed, the irradiated silicon takes only a hybrid orbit $SP^3$ and suppresses graphite separation, whereby effectively functions for diamond formation.

The accelerating energy of the ions 12 should preferably be about 40 keV or less. If the energy exceeds 40 KeV, the inside of the diamond film will be damaged (become defective) and the diamond film formation rate may decrease due to the sputtering by the ions.

When the vapor deposition of the carbon 6 and the irradiation of the ions 12 are alternately carried out, the former is preceded and moreover the thickness of the film thus deposited should roughly be equivalent to the range (average injection range) of the irradiated ions. Since, in that case, only the previously deposited film can throughly be changed into diamond. The film thickness required is measured by the film thickness monitor 14.

Further, the substrate 20 may be heated by heating means up to several hundred degrees during the film formation. In that case, the reaction for the diamond formation is accelerated.

The features of the method of forming a diamond film according to the present invention are summarized as follows:

(1) When silicon is contained in the irradiated ions 12, the separation of graphite can be suppressed, whereby a diamond film uniform in quality is obtainable.

(2) Low temperature processing is possible and therefore the range of the quality of the material usable for the substrate 20 is enlarged.

(3) Use of accelerated ions 12 allows the formation of a mixing layer 22 containing component materials of both the substrate 20 and the diamond film 24 at the vicinity of the interface therebetween. The diamond film 24 thus sticks to the substrate 20 and hardly peels off because the mixing layer functions as a wedge.

(4) Since the vapor deposition of the carbon 6 is employed, a greater film thickness is obtained in a short time as compared with the conventional method. That is, efficiency of the formation of the diamond film 24 is high.

With reference to FIGS. 3-11, a specific example will be described in detail.

Figure 3:
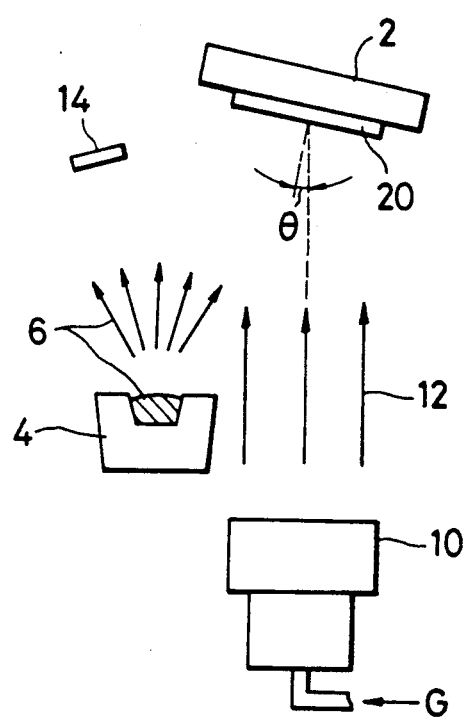
FIG. 3 is a schematic view of an apparatus for use in the present invention.

FIG. 3 is a schematic view of an apparatus employed in this example. The apparatus is identical to that of FIG. 1 except that the substrate 20 inclines relative to the irradiation direction of ions. The same reference characters as those in FIG. 1 designate the same or like parts.

In this example, neon (Ne) ions 12' of a sort of inert gas ion are used to prevent impurities from entering the film. Accordingly, the ion source 10 is supplied with the neon gas as the gas G.

The method of forming the film comprises discharging air from a vacuum container to an extent of about $10^{-5}$–$10^{-7}$ Torr, depositing the carbon 6 from the evaporation source 4 onto the substrate 20 and simultaneously or alternately irradiating the neon ions 12' from the ion source 10 to the substrate 20. In consequence, the film as described later is formed on the substrate 20.

In this case, the incident angle of the neon ions 12' to the perpendicular of the surface of the substrate 20 is preferably set at about 0°-60° to prevent the sputtering of the deposited carbon 6.

Furthermore, the temperature of the substrate 20 may be set at about room temperature and, if necessary, it may be heated up to several hundred °C. to remove the defects caused in the film by the irradiation of neon ions 12' or thermal excitation.

Subsequently, a description will be given of the results of experiments wherein the energy E(eV) of the neon ions 12' and the ratio Ne/C(%) of the quantity of neon ions to that of carbon atoms transported to the substrate 20 are changed to various degrees. In that case, a silicon substrate was used as the substrate 20 and the incident angle of the neon ions 12' was set at 0° and further the film was prepared at the room temperature (i.e., the substrate 20 was not particularly heated).

Figure 4:
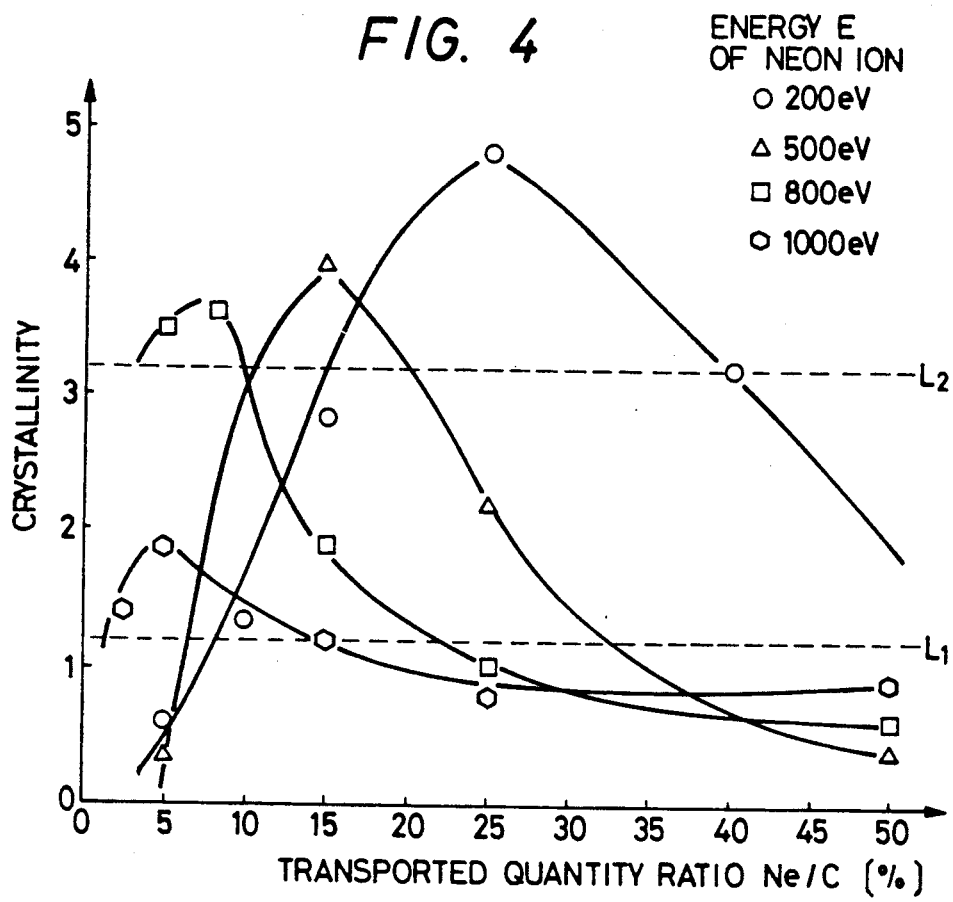
FIG. 4 is a graph showing the relation of the crystallinity of a diamond film and the ratio of the quantity of neon ions to that of the carbon atoms supplied to a substrate when the energy of the neon ions is selectively changed.

FIG. 4 shows the change of crystallinity of the film made on the substrate 20 against the change of the aforesaid transported quantity ratio Ne/C when the energy E of the ions 12' is selected at 200 eV, 500 eV, 800 eV and 1,000 eV, respectively.

The crystallinity is obtained by dividing the absorption factors (%) at the infrared absorption wave number 2,300 cm$^{-1}$ corresponding to a pure diamond by the thickness (Å) of the film when the infrared absorption spectra of the film on the substrate 20 are measured using the Fourie Transform Infrared Spectrometer (FT-IR). As the value of the crystallinity becomes large, the rate of diamond crystals becomes high.

When the crystalline structures obtained under the conditions at the points shown in FIG. 4 were evaluated using transmission electron beam diffraction patterns, it was proved that carbon or graphite was obtained under the conditions below a broken line $L_1$ therein, that a mixture of diamond crystals and graphite under the conditions between broken lines $L_1$ and $L_2$ and that almost wholly diamond crystals under the conditions above the broken line $L_2$.

Figure 5:
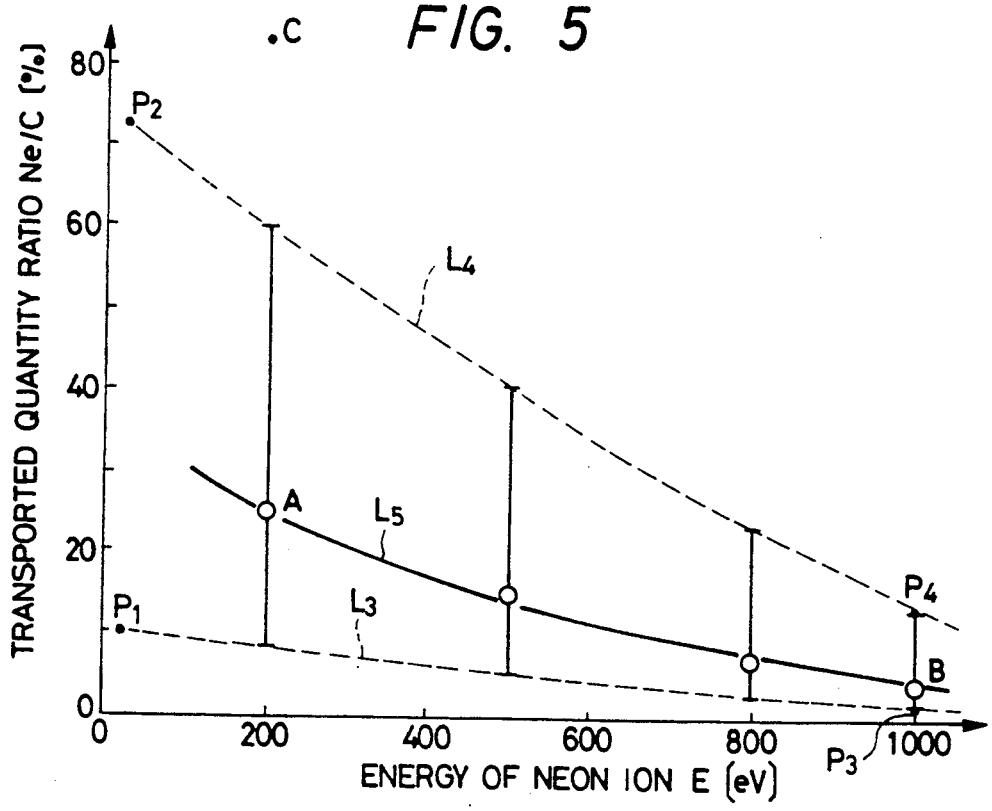
FIG. 5 is a graph showing conditions under which diamond crystals grows in terms of the relation of the energy of neon ions and the ratio of the quantity of the neon ions to that of the carbon atoms supplied to the substrate.

FIG. 5 shows conditions under which the diamond crystals grow in the rectangular coordinate in terms of the energy E of the neon ions 12' and the aforesaid transported quantity ratio Ne/C on the basis of the data of FIG. 4. The region enclosed with broken lines $L_3$ and $L_4$ indicates the conditions under which the diamond crystals grow, which correspond to the conditions above the broken line $L_1$ of FIG. 4. Moreover, the region on a continuous line $L_5$ indicates the optimum conditions under which the diamond crystals grow and the conditions correspond to those at the apexes of the curves above the broken line $L_2$ of FIG. 4.

Figure 6:
FIGS. 6 through 8 are the image of scanning electron microscope photographs for the surfaces of films prepared under conditions at points A through C.
Figure 9:
FIGS. 9 through 11 are transmission electron beam diffraction patterns of film prepared under conditions at points A through C.
Figure 7:
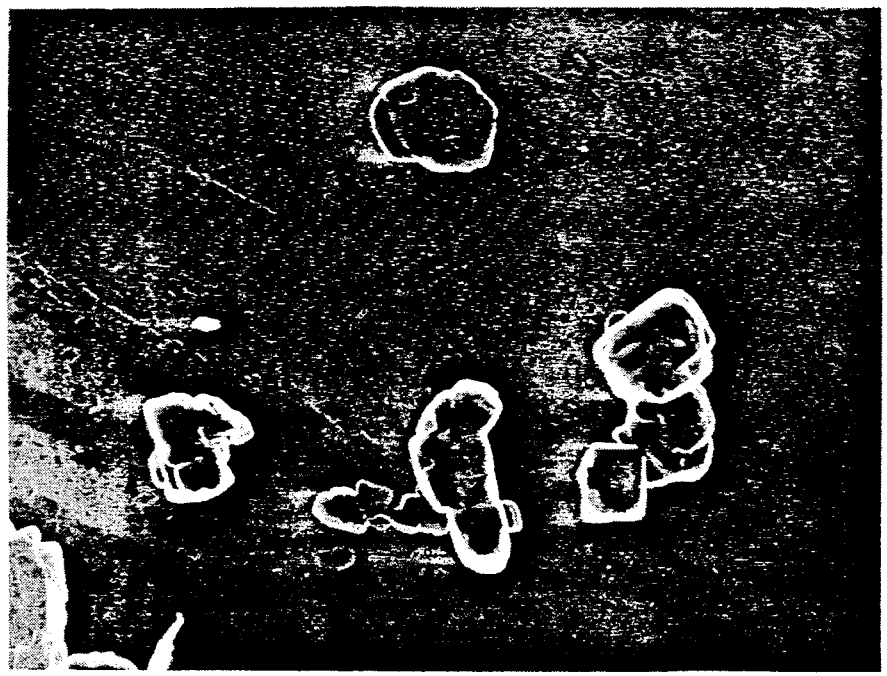
Figure 10:
Figure 8:
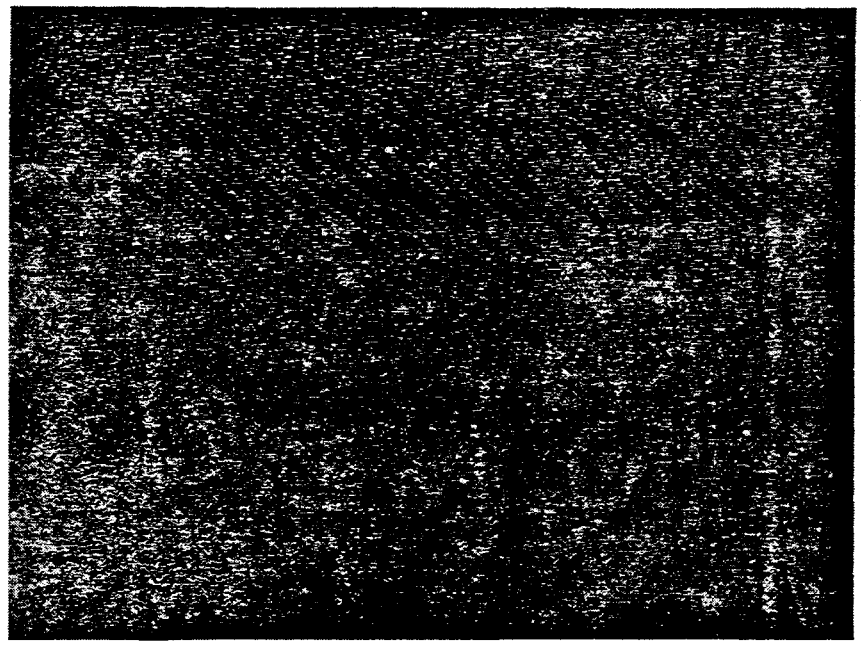
Figure 11:

FIGS. 6, 7 and 8 respectively show the image of scanning electron microscope photographs (10,000 magnifications) prepared under the conditions at points A (200 eV, 25%), B (1,000 eV, 5%) and C (200 eV, 88%), whereas FIGS. 9, 10 and 11 respectively show the transmission electron diffraction patterns thereof.

As shown in the drawings, a number of diamond crystals are seen to have grown at the points A and B despite the treatment under the room temperature and moreover the greater number of them is seen to have grown at the point A, whereas no diamond crystals are seen at the point C.

In other words, it is seen from FIG. 5 that a diamond film containing diamond crystals is obtained on the substrate 20 provided the energy E (eV) of the neon ions 12' and the ratio Ne/C (%) of the quantity of neon ions to that of carbon atoms transported to the substrate 20 exist in the region roughly enclosed with four points: point $P_1$ (10, 10); $P_2$ (10, 73), $P_3$ (1,000, 1) and $P_4$ (1,000, 15).

Under the aforesaid conditions, the neon ions 12' are considered effective as the nucleus forming energy supplying sources to grow diamond crystals from the carbon deposited on the substrate 20.

In this case, the upper limit of the energy E of the neon ions is set at 1,000 eV in order to relieve the occurrence of any damage (defects) in the diamond film or the sputtering of the diamond film due to the irradiation of the neon ions 12'. The lower limit is set at 10 eV because the value is practically a minimum one in consideration of the ion source 10, etc.

The features of the method of forming a diamond film in this example of the present invention can be summarized as follows:

(1) When the conditions such as the energy of the neon ions 12' are selected in the range described above, the separation of graphite can be suppressed and a diamond film containing many diamond crystals is obtainable.

(2) Since the neon ions 12' are inert gas ions and relatively light in weight, they are easily extracted from the film, so that a diamond film free from impurities and of good quality is obtainable.

(3) The range of the quality of the material usable as the substrate 20 is enlarged because the diamond film is obtainable without using thermal excitation substantially but at low temperature such as the room temperature.

Although a description has been given of a case where the vapor deposition of carbon and the irradiation of neon ions are employed, it is also possible to make a diamond film likewise by means of other methods such the ion plating method if carbon atoms and neon ions having kinetic energy are transported to a substrate under the conditions similar to those described above.

As described above, according to the present invention, the separation of graphite is suppressed and a diamond film free from impurities and of good quality can be obtained. Moreover, the range of the quality of the material usable as a substrate is enlarged because the diamond film can be made at temperatures as low as the room temperature.

What is claimed is:

1. A method of forming a diamond film on a substrate, comprising the steps of:
   depositing carbon from an evaporation source onto said substrate in vacuum by vapor deposition to provide a carbon film on the substrate; and
   irradiating accelerated ions having an energy of less than 40 KeV onto said substrate, said ions being obtained by ionizing a gas composed of at least one of a hydrogen gas, inert gases, and silicon base gases.

2. A method of forming a diamond film on a substrate as claimed in claim 1, wherein said silicon base gases are monosilane and dislane gases.

3. A method of forming a diamond film on a substrate as claimed in claim 1, wherein the degree of vacuum is $10^{-5}$–$10^{-7}$ Torr.

4. A method of forming a diamond film on a substrate as claimed in claim 1, wherein said depositing and irradiating steps are carried out at a temperature within the range of room temperature to that of several hundred degrees.

5. A method of forming a diamond film comprising the steps of transporting carbon atoms from an evaporation source and neon ions having kinetic energy to provide a carbon film on a substrate in vacuum, wherein said energy (eV) of said neon ions and the ratio (%) of the quantity of said transported neon ions to that of said transported carbon atoms are selected within the region enclosed with four points (10, 10), (10, 73), (1,000, 1) and (1,000, 15) in rectangular coordinates made up of said energy as the abscissa and said ratio as the ordinate.

6. A method of forming a diamond film as claimed in claim 5, wherein an incident angle of said transported neon ions relative to a perpendicular of a surface of said substrate is 0°–60°.

7. A method of forming a diamond film as claimed in claim 5, wherein the degree of vacuum is $10^{-5}$–$10^{-7}$ Torr.

8. A method of forming a diamond film as claimed in claim 5, wherein said transporting steps are carried out at a temperature within the range of room temperature to that of several hundred degrees.

* * * * *